United States Patent
Lee

(10) Patent No.: US 7,560,356 B2
(45) Date of Patent: Jul. 14, 2009

(54) FABRICATION METHOD OF TRENCH CAPACITOR

(75) Inventor: Richard Lee, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/954,201

(22) Filed: Dec. 11, 2007

(65) Prior Publication Data
US 2008/0090373 A1    Apr. 17, 2008

Related U.S. Application Data

(62) Division of application No. 11/388,855, filed on Mar. 23, 2006.

(51) Int. Cl.
*H01L 21/20* (2006.01)

(52) U.S. Cl. ............... 438/386; 438/389; 257/E21.008

(58) Field of Classification Search ............... 438/243, 438/386, 389; 257/E21.008, E21.364
See application file for complete search history.

(56) References Cited

U.S. PATENT DOCUMENTS 4,859,622 A * 8/1989 Eguchi ................. 438/389

6,661,050 B2 * 12/2003 Tzeng et al. ............... 257/301
2004/0012022 A1 * 1/2004 Wu ................................ 257/68

FOREIGN PATENT DOCUMENTS

| CN | 1567566 | 1/2005 |
|---|---|---|
| EP | 0684637 | 11/1995 |

* cited by examiner

*Primary Examiner*—Charles D. Garber
*Assistant Examiner*—Stanetta D Isaac
(74) *Attorney, Agent, or Firm*—Jianq Chyun IP Office

(57) ABSTRACT

A method of fabricating trench capacitors is provided. A plurality of trenches is formed in the substrate by performing a patterning process with a patterned mask layer on a substrate. A bottom electrode is formed in the substrate of the surface of the trench. A portion of the patterned mask layer is removed so as to expose a portion of the substrate at two sides of the top of the trench. A capacitor dielectric layer is formed on the substrate and the surface of the trench. A conductive layer is formed over the substrate. The conductive layer is at least filled into the trench and covers the capacitor dielectric layer. The patterned mask layer and a portion of the conductive layer are removed and the portion of the conductive layer which covers the capacitor dielectric layer is reserved as to form a top electrode.

12 Claims, 6 Drawing Sheets

FABRICATION METHOD OF TRENCH CAPACITOR

CROSS-REFERENCE TO RELATED APPLICATION

This application is a divisional of an application Ser. No. 11/388,855, filed on Mar. 23, 2006, now pending. The entirety of each of the above-mentioned patent applications is hereby incorporated by reference herein and made a part of this specification.

BACKGROUND OF THE INVENTION

1. Field of the Invention

The present invention relates to a memory capacitor and a fabrication method thereof, and more particularly, to a trench capacitor and a fabrication method thereof.

2. Description of the Related Art

Due to minimization of devices, device dimensions are required shrinkage. For memory devices with capacitors, areas for fabrication of capacitors also are continuously reduced. A trench capacitor memory device is a device with a capacitor formed in the substrate that it solves the issue of device minimization.

The prior art method of fabricating a trench capacitor is shown in FIG. 1A. Referring to FIG. 1A, a silicon oxide layer 102 and a silicon nitride layer 104 are sequentially formed over a substrate 100. Then, an etch process is performed to remove portions of the silicon oxide layer 102 and the silicon nitride layer 104 to form openings 106 which expose the surface of the substrate 100.

Referring to FIG. 1B, a portion of the substrate 100 is removed to form a plurality of trenches 108 therein by using the silicon oxide layer 102 and the silicon nitride layer 104 as an etch mask. Then, a doped region 110 is formed in the substrate 100 of the surface of the trenches 108.

Referring to FIG. 1C, an oxide/nitride/oxide (ONO) layer 112 is formed over the surface of the trenches 108. A doped polysilicon layer 114 is deposited in the trenches 108. A chemical-mechanical polish (CMP) process then is performed to remove a portion of the doped polysilicon layer 114 until the surface of the silicon nitride layer 104 is exposed.

Referring to FIG. 1D, the silicon oxide layer 102 and the silicon nitride layer 104 are removed. Moreover, a portion of the doped polysilicon layer 114 is removed to expose the surface of the substrate 100.

In the prior art method mentioned above, the step shown in FIG. 1D of removing silicon oxide layer 102, the silicon nitride layer 104 and the portion of the doped polysilicon layer 114 to expose the surface of the substrate 100 may damage the surface of the ONO layer 112. That causes leakage currents and affects the process reliability and yields. After the step shown in FIG. 1D, the surface of the ONO layer 112 is also exposed. In the subsequent processes, such as the doping process and the etch process to define the active area and form the device, the surface of the ONO layer 112 of the trench capacitor is subject to damage as well.

U.S. Pat. No. 6,661,050 B2 discloses a memory cell structure with a trench capacitor and a fabrication method thereof. U.S. Pat. No. 6,808,980 B2 discloses a trench-type one-transistor random access memory (1T-RAM) structure and a fabrication method thereof. However, the patents can be more complicated for the process, and can't effectively solve the above-mentioned question.

SUMMARY OF THE INVENTION

Accordingly, the present invention is directed to a method of fabricating a trench capacitor. According to this method, the surface damage of the capacitor dielectric layer, which causes leakage currents and affects process reliability and yields, can be avoided.

The present invention also is directed to a trench capacitor. In the trench capacitor, the surface of the capacitor dielectric layer is protected without being subject to damage. As a result, process reliability and yields are improved.

The present invention provides a method of fabricating a trench capacitor. According to this method, a patterning process is performed to a substrate by using a patterned mask layer over the substrate to form a plurality of trenches. Then, a bottom electrode is formed in the substrate of surfaces of the trenches. Later, a portion of the patterned mask layer is removed to expose a portion of the substrate at two sides of the top of each of the trenches. A capacitor dielectric layer then is formed over the substrate and the surfaces of the trenches. Next, a conductive layer is formed over the substrate. The conductive layer at least fills the trenches and covers the capacitor dielectric layer. Then, the patterned mask layer and a portion of the conductive layer are removed; and a portion of the conductive layer, which covers the capacitor dielectric layer, is reserved to form a top electrode.

According to an embodiment of the present invention, the method of removing the portion of the patterned mask layer to expose the portion of the substrate at the two sides of the top of each of the trenches described above can be, for example, an isotropic etch method.

According to an embodiment of the present invention, after the top electrode is formed, the method further comprises forming an isolation structure in the conductive layer, the capacitor dielectric layer and a portion of the substrate between two neighboring trenches. Wherein, the isolation trench structure comprises a shallow trench isolation (STI) structure.

According to an embodiment of the present invention, the capacitor dielectric layer described above can be, for example, a high-k dielectric material layer. The material of the high-k dielectric material layer can be, for example, silicon oxide/silicon nitride/silicon nitride (ONO), silicon nitride/silicon oxide (NO), tantalum oxide ($Ta_2O_5$) layer, zirconium oxide ($ZrO_2$), hafnium oxide ($HfO_2$) or barium strontium titanate (BST). The method of forming the capacitor dielectric layer can be, for example, a chemical vapor deposition (CVD) method or a sputtering method.

According to an embodiment of the present invention, the patterned mask layer described above comprises, sequentially over the substrate, a patterned pad oxide layer and a patterned silicon nitride layer.

According to an embodiment of the present invention, the material of the conductive layer can be, for example, doped polysilicon. The method of forming the conductive layer can be, for example, a CVD method.

According to an embodiment of the present invention, the bottom electrode described above can be, for example, a doped region. Wherein, the method of forming the bottom electrode can be, for example, an ion implantation method or a thermal diffusion method.

The present invention further provides a trench capacitor, which is disposed in a trench of a substrate. The trench capacitor comprises a bottom electrode, a capacitor dielectric layer, a top electrode and an isolation structure. Wherein, the bottom electrode is disposed in the substrate of a surface of the trench. The capacitor dielectric layer is disposed over the surface of the trench and over a portion of the substrate at two sides of the top of the trench. Additionally, the top electrode is disposed in the trench and over the substrate. The top electrode covers the capacitor dielectric layer. The isolation structure is disposed in portions of the capacitor dielectric layer, the top electrode and the substrate.

According to an embodiment of the present invention, the capacitor dielectric layer described above can be, for example, a high-k dielectric material layer. The material of the high-k dielectric material layer can be, for example, silicon oxide/silicon nitride/silicon nitride (ONO), silicon nitride/silicon oxide (NO), tantalum oxide ($Ta_2O_5$), zirconium oxide ($ZrO_2$), hafnium oxide ($HfO_2$) or barium strontium titanate (BST). The method of forming the capacitor dielectric layer can be, for example, a chemical vapor deposition (CVD) method or a sputtering method.

According to an embodiment of the present invention, the top electrode described above can be, for example, a conductive layer. The material of the conductive layer comprises doped polysilicon.

According to an embodiment of the present invention, the bottom electrode described above can be, for example, a doped region.

According to an embodiment of the present invention, the isolation structure described above can be, for example, an STI structure.

According to the present invention, a portion of the mask layer is removed so that the mask layer is pulled back and a portion of the substrate at two sides of the top of the trench is exposed. Accordingly, the subsequent top electrode is formed on the exposed substrate at two sides of the top of the trench. During the subsequent doping process and etch process, the top electrode protects the surface of the capacitor dielectric layer from damage. In other words, the prior art surface damage of the capacitor dielectric layer, which causes leakage currents and affects process reliability and yields, can be avoided.

The above and other features of the present invention will be better understood from the following detailed description of the preferred embodiments of the invention that is provided in communication with the accompanying drawings.

DESCRIPTION OF SOME EMBODIMENTS

FIGS. 2A-2H are cross sectional views showing progress of a method of fabricating a memory according to an embodiment of the present invention.

Figure 1A:
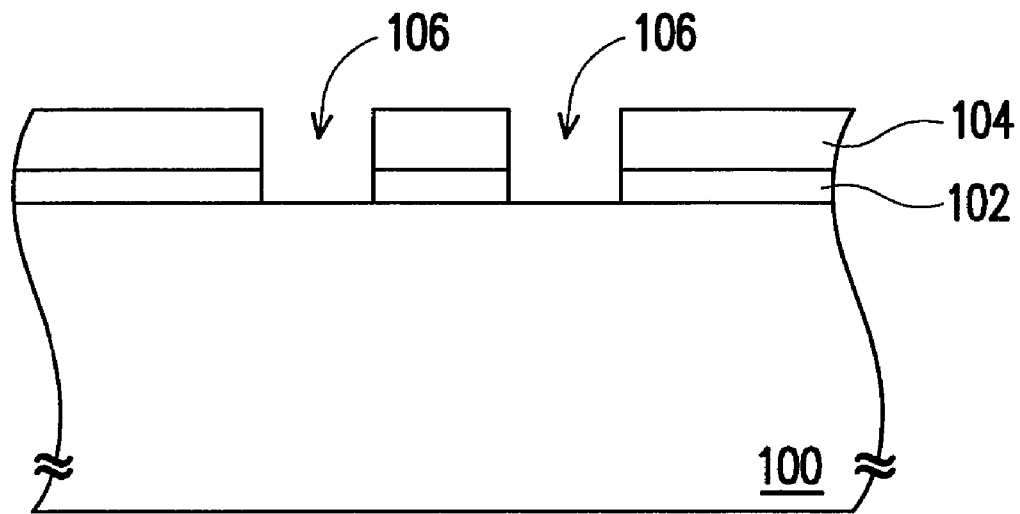
FIGS. 1A-1D are cross sectional views showing progress of a prior art method of fabricating a trench capacitor.
Figure 1B:
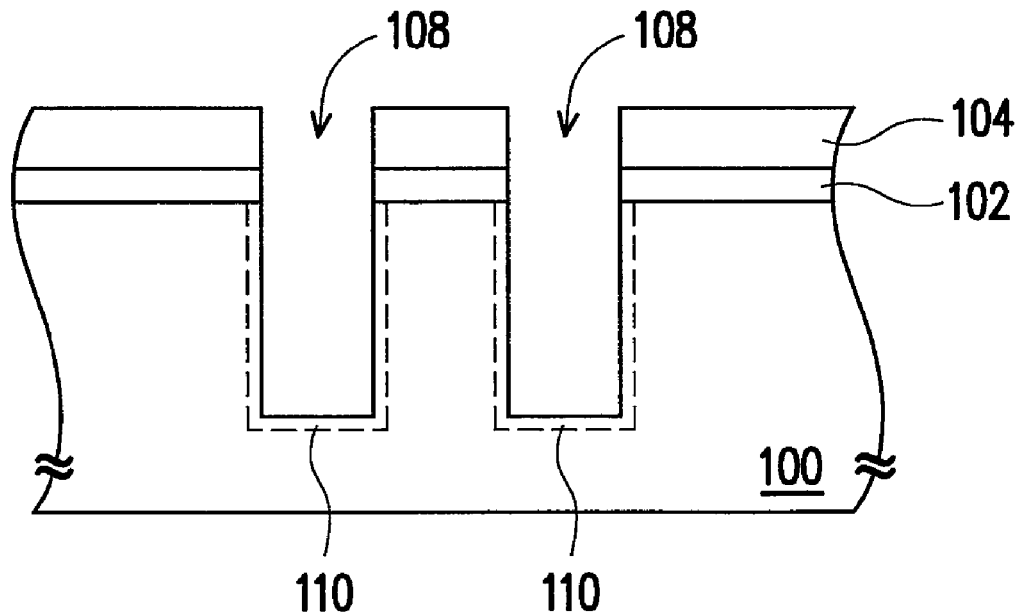
Figure 1C:
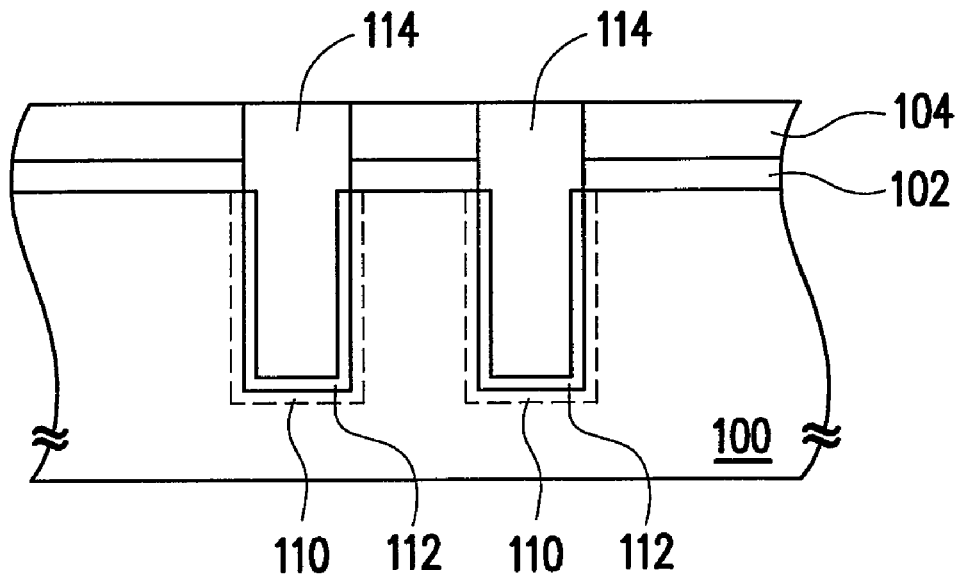
Figure 1D:
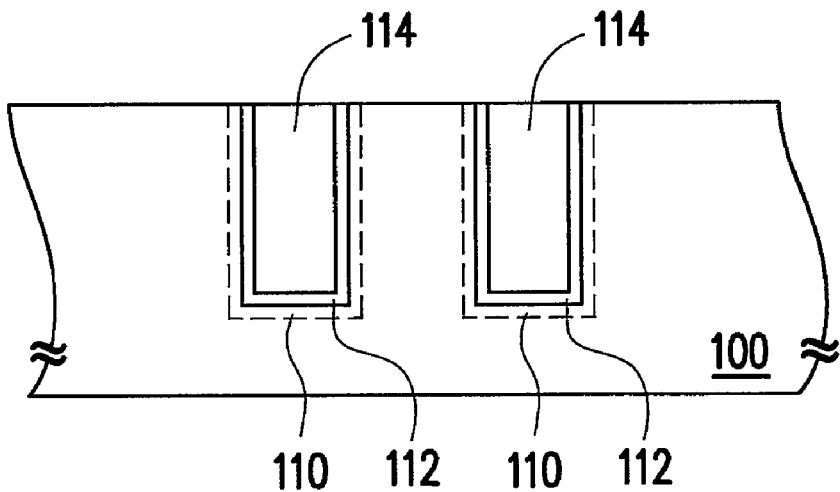
Figure 2A:
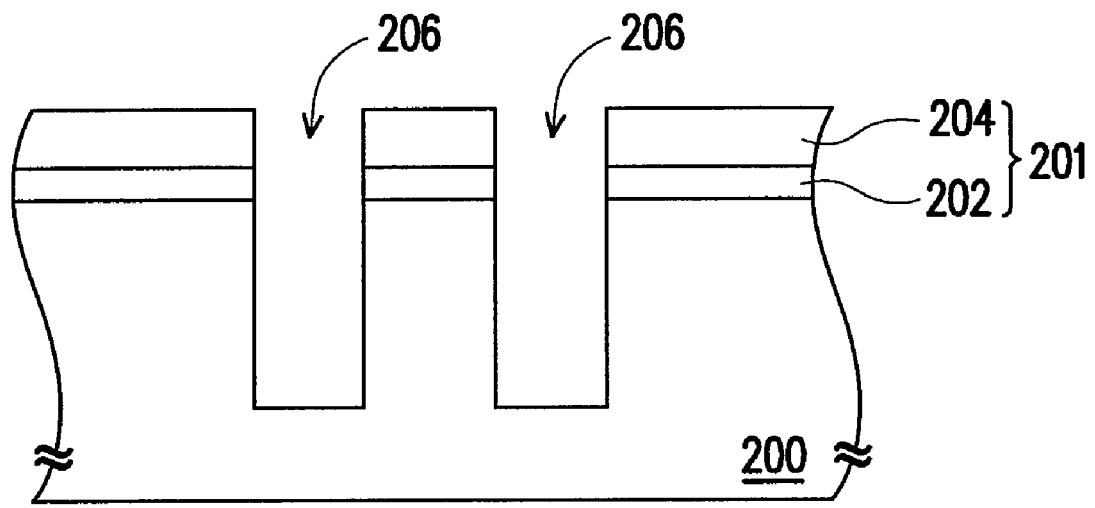
FIGS. 2A-2H are cross sectional views showing progress of a method of fabricating a memory according to an embodiment of the present invention.

Referring to FIG. 2A, a substrate 200 is provided. A mask layer 201 is formed over the substrate 200. The mask layer 201 comprises, for example, a pad oxide layer 202 and a silicon nitride layer 204, which are sequentially formed over the substrate 200. The method of forming the pad oxide layer 202 can be, for example, a thermal oxidation method. The method of forming the silicon nitride layer 204 can be, for example, a chemical vapor deposition (CVD) method. Then, the pad oxide layer 202 and the silicon nitride 204 are patterned, and the substrate 200 is etched to form a plurality of trenches 206 in the substrate 200.

Figure 2B:
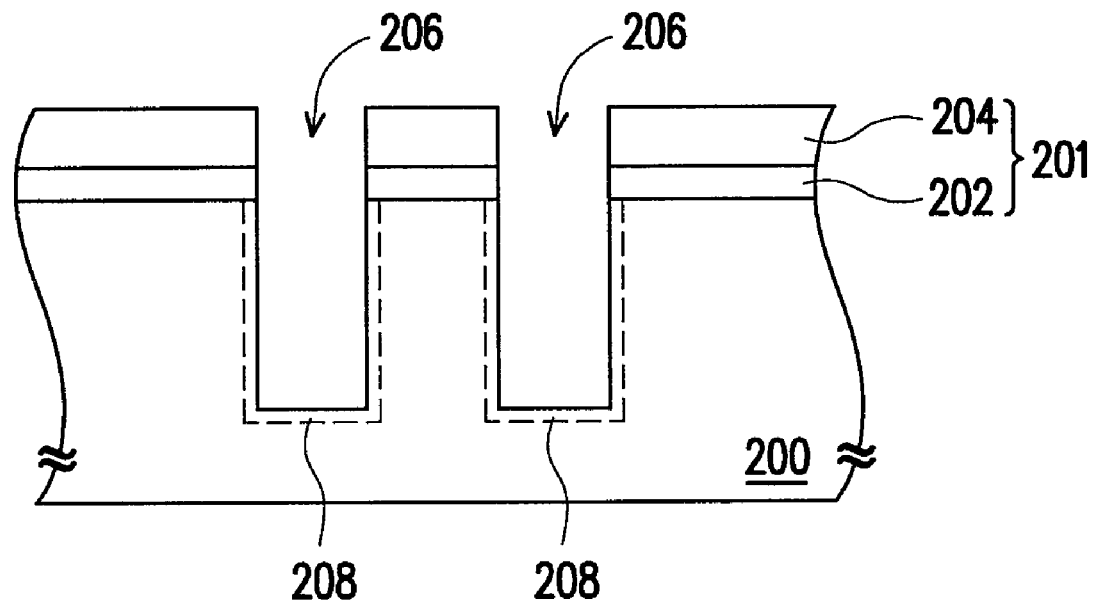

Referring to FIG. 2B, a bottom electrode 208 is formed in the substrate 200 of the surfaces of the trenches 206. In the method of forming the bottom electrode 208, a doped silicon oxide layer is first formed on the inner surfaces of the trenches 206, for example. Then, a thermal process is performed to diffuse the dopant ions in the doped silicon oxide layer into the trenches 206 to form the bottom electrode 208. Wherein, the dopant ions in the doped silicon oxide layer can be, for example, arsenic ions. The method of forming the doped silicon oxide layer can be, for example, a low pressure CVD (LPCVD) method. Additionally, the method of forming the bottom electrode 208 can be, for example, a multiple-angle ion implantation process so as to form the doped regions serving as the bottom electrode 208 in the substrate 200 of the surfaces of the trenches 206.

Figure 2C:
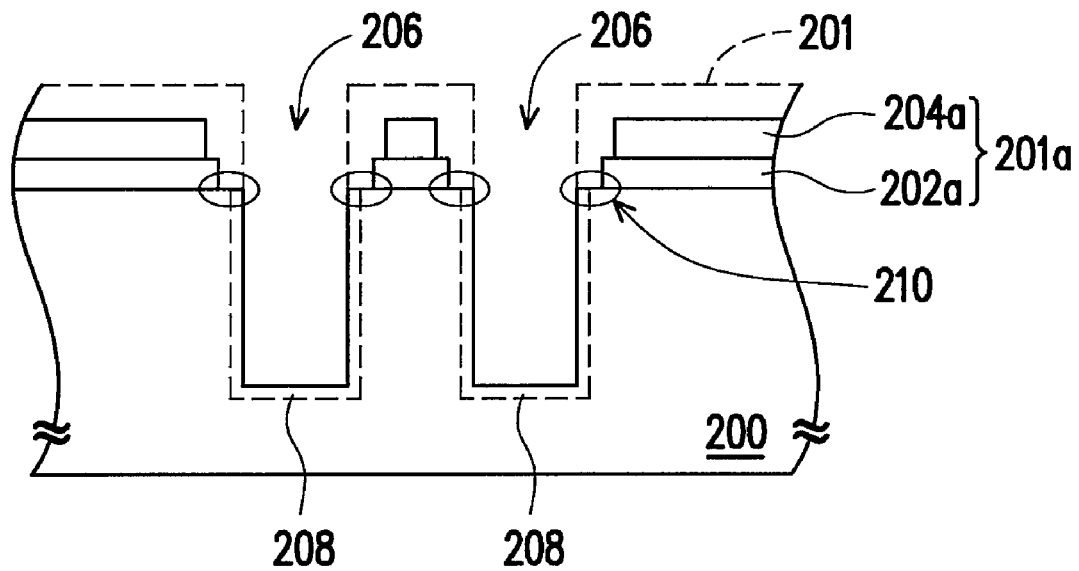

Referring to FIG. 2C, a portion of the mask layer 201 is removed to expose a portion of the substrate 200 at two sides of the top of each trench 206. The method of removing the portion of the mask layer 201 can be, for example, an isotropic etch process. The isotropic etch process removes portions of the silicon nitride layer 204 and the pad oxide layer 202. In other words, the step described above removes the portion of the mask layer 201 and pulls back the mask layer 201 to form the mask layer 201a. As a result, the portion of the substrate 200 at two sides of the top of the trench 206 is exposed (as shown by arrow 210).

Figure 2D:
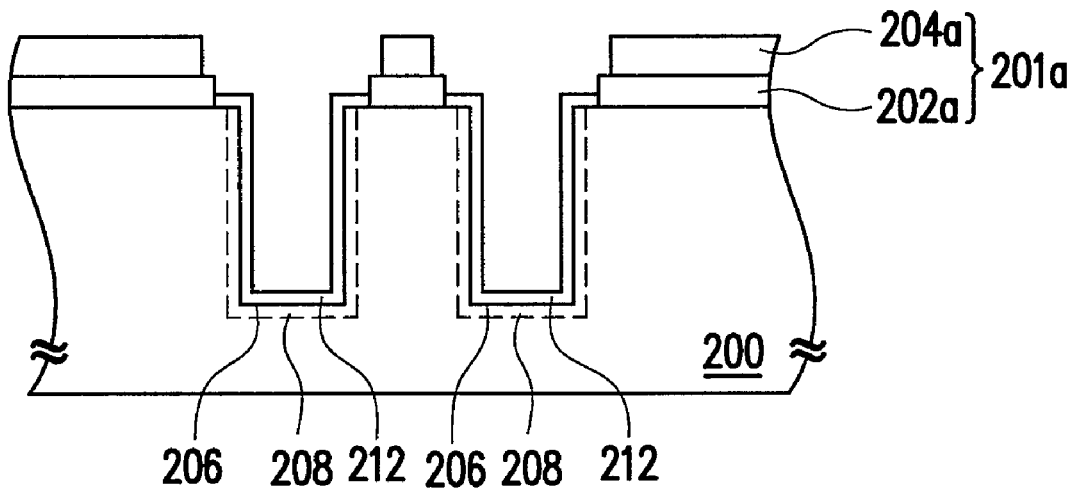

Referring to FIG. 2D, a capacitor dielectric layer 212 is formed over the substrate 200 and over the surfaces of the trenches 206. Wherein, the capacitor dielectric layer 212 can be, for example, a high-k dielectric material layer to increase the capacitance of the capacitor. The material of the high-k dielectric material layer can be, for example, silicon oxide/silicon nitride/silicon nitride (ONO), silicon nitride/silicon oxide (NO), tantalum oxide ($Ta_2O_5$), zirconium oxide ($ZrO_2$), hafnium oxide ($HfO_2$), barium strontium titanate (BST) or other high-k dielectric material. The method of forming the capacitor dielectric layer 212 can be, for example, a chemical vapor deposition (CVD) method or a sputtering method.

Figure 2E:
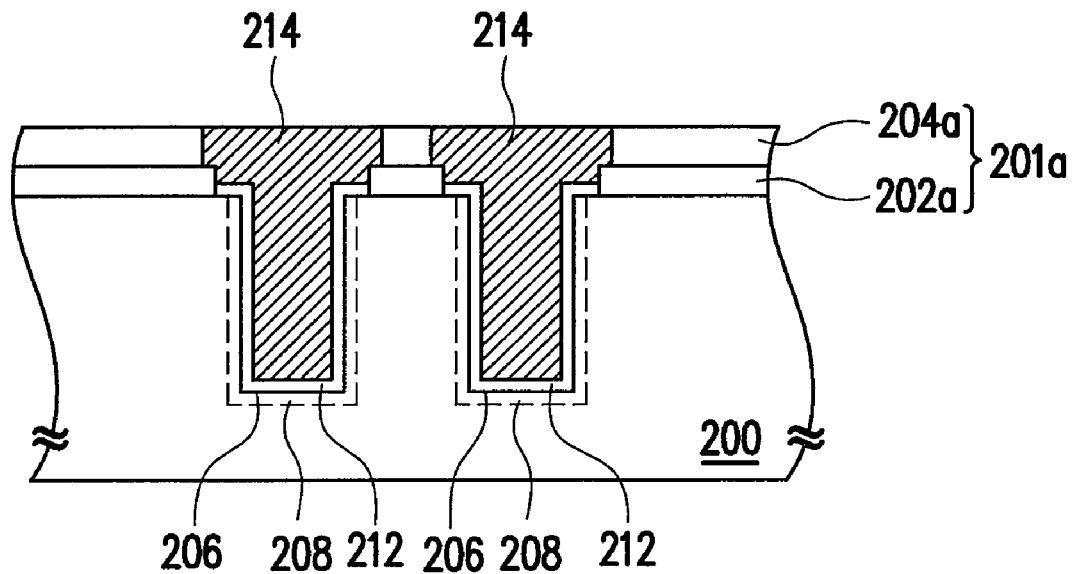

Referring to FIG. 2E, a conductive layer 214 is formed over the substrate 200. The conductive layer 214 at least fills the trenches 206 and covers the capacitor dielectric layer 212. Wherein, the material of the conductive layer 214 can be, for example, doped polysilicon. The method of forming the conductive layer 214 can be, for example, a CVD method.

Figure 2F:
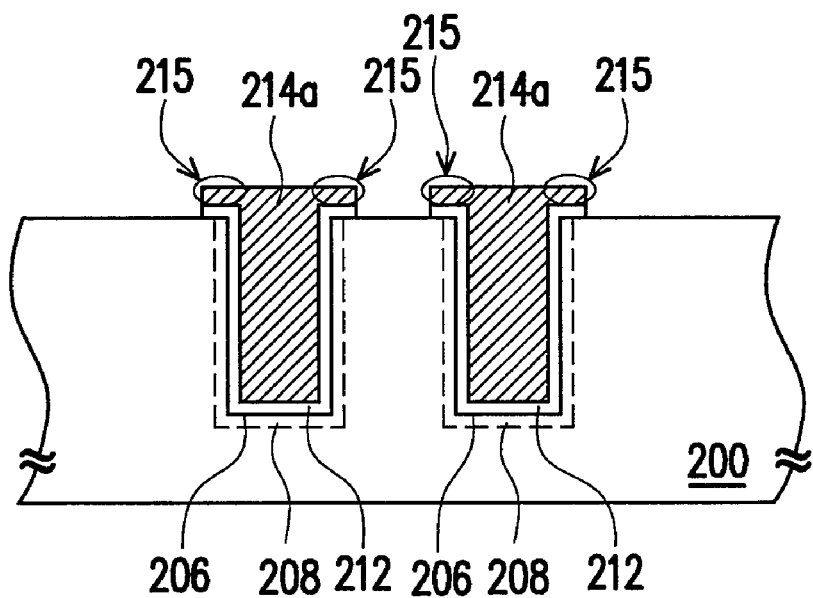

Referring to FIG. 2F, the mask layer 201 a and the portion of the conductive layer 214 are removed; and the portion of the conductive layer 214, which covers the capacitor dielectric layer 212, is reserved to constitute a conductive layer 214a. The conductive layer 214a serves as a top electrode. Wherein, the top electrode, i.e., the conductive layer 214a, the capacitor dielectric layer 212 and the bottom electrode 208 constitute a trench capacitor.

Particularly note that the top electrode (the conductive layer 214a) of the trench capacitor of the present invention is not only the conductive material layer formed in the trenches 206 and over the substrate 200, but also serves as the conductive material layer covering the capacitor dielectric layer 212 (arrow 215 shown in FIG. 2F). In the subsequent doping and etch processes, the top electrode (the conductive layer 214a) protects the surface of the capacitor dielectric layer 212 from being damaged. In other words, the prior art surface damage of the capacitor dielectric layer 213, which causes leakage currents and affects process reliability and yields, can be avoided.

Moreover, the portion of the top electrode (the conductive layer 214a) indicated by the arrow 215 shown in FIG. 2F is self-aligned formed and covers the capacitor dielectric layer 212 without performing a photolithographic process.

Figure 2G:
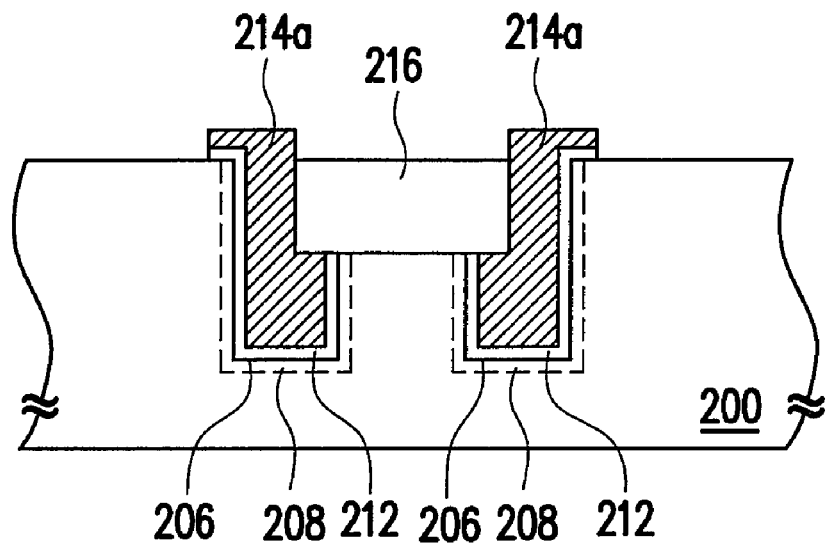

After the formation of the trench capacitor, an active device can further be fabricated. Referring to FIG. 2G, an isolation structure 216 is formed between the conductive layer 214a, the capacitor dielectric layer 212 and the portion of the substrate 200 located between two neighboring trenches 206. The area between two neighboring isolation structures 216 is called an active area (AA). The isolation structures 216 can be, for example, a shallow trench isolation (STI) structure. The method of forming the isolation structures 216 can be, for example, removing the capacitor dielectric layer 212 located between the two neighboring trenches 206, the conductive layer 214a and the portion of the substrate 200. Further, a portion of the conductive layer 214a between two neighboring trenches 206 and a portion of the capacitor dielectric layer 212 are removed to form an opening. Then, an insulating material layer is filled in the opening to form the isolation structure 216. Wherein, the material of the insulating material layer can be, for example, silicon oxide. The method of forming the insulating material layer can be, for example, a CVD method.

Figure 2H:
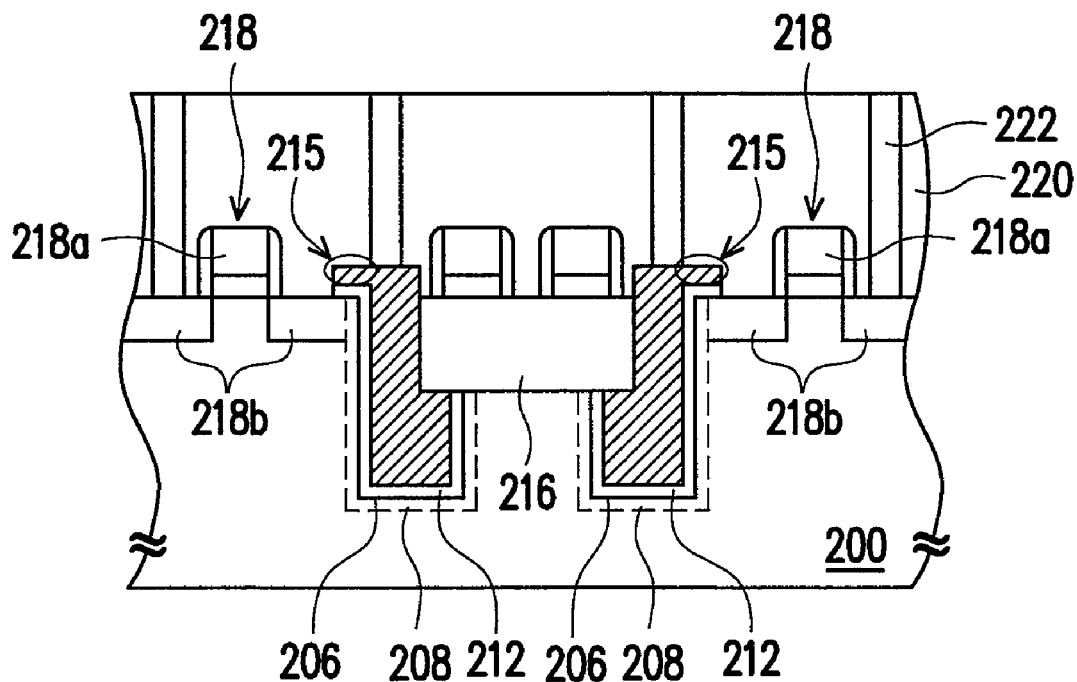

Referring to FIG. 2H, an active device 218 is formed over the substrate 200. According to the method of forming the active device 218, a plurality of gate structures are formed over the substrate 200 of the active area and over the surfaces of the isolation structures 216, for example. Wherein, the gate structures over the substrate 200 of the active area serve as the gate 218a of the active device 218. Then, spacers are formed on the sidewalls of the gate structures. An ion implantation process is performed to form source/drain regions 218b in the substrate 200 adjacent to the two sides of the gate 218a. The active device 218 electrically connects with the bottom electrode 208 of the trench capacitor through the source/drain regions 218b. Wherein, the active device 218 described above can be, for example, an N-type metal-oxide-semiconductor (NMOS) transistor, or a PMOS transistor.

After the formation of the active device 218, the subsequent interconnect process is performed. Referring to FIG. 2H, according to the interconnect process the dielectric layer 220 is formed over the substrate 200, for example. Contact 222 are formed in the dielectric layer 220. Conductive lines (not shown) then are formed to connect with the contacts 222. Thus electrical connection between or among devices is established. Note that the top electrode (the conductive layer 214a) of the trench capacitor of the present invention includes the portion of the top electrode (the conductive layer 214a, as shown by arrow 215 in FIG. 2F) which covers the capacitor dielectric layer 212. Accordingly, while the contacts are defined, a larger process window is obtained to improve the accuracy of process.

Following is description of the memory structure fabricated by the method of the present invention. Referring to FIG. 2H, the memory comprises a trench capacitor and the active device 218. The trench capacitor comprises the bottom electrode 208, the capacitor dielectric layer 212, the top electrode (the conductive layer 214a) and the isolation structure 216. Wherein, the bottom electrode 208 is disposed in the substrate 200 of the surface of the trench 206. The bottom electrode 208 can be, for example, a doped region. The capacitor dielectric layer 212 is disposed over the surface of the trench 206 and over the portion of the substrate 200 of two sides of the top of the trench 206. The capacitor dielectric layer 212 can be, for example, a high-k dielectric material layer. The material of the high-k dielectric material layer can be, for example, silicon oxide/silicon nitride/silicon nitride (ONO), silicon nitride/silicon oxide (NO), tantalum oxide ($Ta_2O_5$), zirconium oxide ($ZrO_2$), hafnium oxide ($HfO_2$) or barium strontium titanate (BST). Additionally, the top electrode (the conductive layer 214a) is disposed in the trench 206 and over the substrate 200, and covers the capacitor dielectric layer 212. Its material can be, for example, doped polysilicon. The isolation structure 216 is disposed in the portions of the capacitor dielectric layer 212 the top electrode (the conductive layer 214a), and is located in the portion of the substrate 200. The isolation structure 216 can be, for example, an STI structure.

In addition, the active device 218 comprises the gate 218a and the source/drain regions 218b. The gate 218a is disposed on the substrate 200 of the side of the trench capacitor. The source/drain regions 218b are disposed in the substrate 200 adjacent to two sides of the gate 218a and electrically connected with the bottom electrode 208 of the trench capacitor. Wherein, in this embodiment the active device 218 can be, for example, an NMOS transistor, or a PMOS transistor.

Accordingly, the present invention includes the following advantages:

1. According to the present invention, the surface of the capacitor dielectric layer is protected from being damaged. In other words, the prior art surface damage of the capacitor dielectric layer, which causes leakage currents and affects process reliability and yields, can be avoided.
2. According to the present invention, the top electrode can be self-aligned formed and covers the capacitor dielectric layer without performing a photolithographic process. Thus, the surface damage of the capacitor dielectric layer, which causes leakage currents and affects process reliability and yields, can be avoided.
3. The structure of the trench capacitor of the present invention enhances defining the opening of contacts so that a larger process window can be obtained to improve the accuracy of process.
4. According to the present invention, a portion of the mask layer is removed and the mask layer is pulled back that the surface of the capacitor dielectric layer is protected. Without a complicated process, the manufacturing yields are improved and the manufacturing costs are reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating a trench capacitor, comprising:
   performing a patterning process to a substrate by using a patterned mask layer over the substrate to form a plurality of trenches;
   forming a bottom electrode in the substrate of surfaces of the trenches;
   removing a portion of the patterned mask layer to expose a portion of the substrate at two sides of a top of each of the trenches, wherein a remaining portion of the patterned mask layer remains on the substrate;
   forming a capacitor dielectric layer over the substrate and the surfaces of the trenches;
   forming a conductive layer over the substrate, the conductive layer at least filling the trenches and covering the capacitor dielectric layer; and
   removing the remaining portion of the patterned mask layer and a portion of the conductive layer; and maintaining a portion of the conductive layer, which covers the capacitor dielectric layer to form a top electrode.

2. The method of fabricating a trench capacitor of claim 1, wherein a method of removing the portion of the patterned mask layer to expose the portion of the substrate at the two sides of the top of each of the trenches comprises an isotropic etch method.

3. The method of fabricating a trench capacitor of claim 1, after the top electrode is formed further comprising forming an isolation structure in the conductive layer, the capacitor dielectric layer and a portion of the substrate between two neighboring trenches.

4. The method of fabricating a trench capacitor of claim 3, wherein the isolation structure comprises a shallow trench isolation (STI) structure.

5. The method of fabricating a trench capacitor of claim 1, wherein the capacitor dielectric layer comprises a high-k dielectric material layer.

6. The method of fabricating a trench capacitor of claim 5, wherein a material of the high-k dielectric material layer comprises silicon oxide/silicon nitride/silicon nitride (ONO), silicon nitride/silicon oxide (NO), tantalum oxide ($Ta_2O_5$), zirconium oxide ($ZrO_2$), hafnium oxide ($HfO_2$), or barium strontium titanate (BST).

7. The method of fabricating a trench capacitor of claim 1, wherein a method of forming the capacitor dielectric layer comprises a chemical vapor deposition (CVD) method or a sputtering method.

8. The method of fabricating a trench capacitor of claim 1, wherein the patterned mask layer comprises, sequentially over the substrate, a patterned pad oxide layer and a patterned silicon nitride layer.

9. The method of fabricating a trench capacitor of claim 1, wherein a material of the conductive layer comprises doped polysilicon.

10. The method of fabricating a trench capacitor of claim 1, wherein a method of forming the conductive layer comprises a CVD method.

11. The method of fabricating a trench capacitor of claim 1, wherein the bottom electrode comprises a doped region.

12. The method of fabricating a trench capacitor of claim 1, wherein a method of forming the bottom electrode comprises an ion implantation method or a thermal diffusion method.

* * * * *